(12) United States Patent
Marakov et al.

(10) Patent No.: US 11,646,734 B1
(45) Date of Patent: May 9, 2023

(54) MICROWAVE-BASED RESET OF PERSISTENT CURRENT QUBITS

(71) Applicants: Alexander Marakov, Columbia, MD (US); Anthony Joseph Przybysz, Linthicum, MD (US); James R. Medford, Columbia, MD (US)

(72) Inventors: Alexander Marakov, Columbia, MD (US); Anthony Joseph Przybysz, Linthicum, MD (US); James R. Medford, Columbia, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 17/745,408

(22) Filed: May 16, 2022

(51) Int. Cl.
*H03K 17/92* (2006.01)
(52) U.S. Cl.
CPC .................................. *H03K 17/92* (2013.01)
(58) Field of Classification Search
CPC ....................................................... H03K 17/92
USPC ......................................................... 327/31
See application file for complete search history.

(56) References Cited

U.S. PATENT DOCUMENTS

| 9,647,662 | B1* | 5/2017 | Abutaleb | G06N 10/00 |
| 2019/0237648 | A1* | 8/2019 | Przybysz | G06N 10/00 |
| 2020/0183768 | A1* | 6/2020 | Berkley | G06N 10/00 |
| 2021/0057631 | A1* | 2/2021 | Swenson | G06N 10/40 |

OTHER PUBLICATIONS

Earnest, et al.: "Realization of a ? System with Metastable States of a Capacitively Shunted Fluxonium"; Physical Review Letters 120, 15504 (2018); DOI: 10.1103/PhysRevLett.120.150504.
Harris, et al.: "Experimental demonstration of a robust and scalable flux qubit"; Physical Review B 81, 134510 (2010); DOI: 10.1103/PhysRevB.81.134510.

* cited by examiner

*Primary Examiner* — Tomi Skibinski
(74) *Attorney, Agent, or Firm* — Tarolli, Sundheim, Covell & Tummino LLP

(57) ABSTRACT

Systems and methods are provided for resetting a qubit comprising a superconducting loop and a compound Josephson junction. A first bias flux is provided to the superconducting loop. A second bias flux is provided to the compound Josephson junction. Each of the first bias flux and the second bias flux are provided such that a given excited state of the qubit is near a top of a potential barrier associated with a potential of the qubit. A continuous microwave signal is generated having a frequency equal to a transition frequency between an other excited state of the qubit and the given excited state.

20 Claims, 3 Drawing Sheets

MICROWAVE-BASED RESET OF PERSISTENT CURRENT QUBITS

GOVERNMENT INTEREST

The invention was made under Government Contract. Therefore, the US Government has rights to the invention as specified in that contract.

TECHNICAL FIELD

This invention relates to quantum systems, and more particularly, to a microwave-based reset of persistent current qubits.

BACKGROUND

Preparation of a qubit into a well-defined initial state is one of the key requirements for any quantum computational algorithm. In particular, for most quantum algorithms, it is assumed that a number of high-fidelity ground state qubits are available to serve as ancilla qubits in various operations. The current method for preparing a persistent current qubit in the ground state is to apply a large direct current (DC) flux shift to destabilize the excited state and wait for it to decay into the ground state. Unfortunately, this requires a relatively high-bandwidth flux bias line in order to apply the destabilizing pulse to the persistent current qubit. The addition of this high-bandwidth control line to the circuit introduces broadband noise, which causes decoherence.

SUMMARY

In accordance with one example, an assembly includes a qubit that includes a superconducting loop interrupted by a compound Josephson junction. A first bias source provides a first bias to the superconducting loop, and a second bias source provides a second bias to the compound Josephson junction. Each of the first bias source and the second bias source are responsive to a system control to allow a first value to be selected for the first bias and a second value to be selected for the second bias. Each of the first value and the second value are selected such that a given excited state of the qubit is near a top of a potential barrier associated with a potential of the qubit. A microwave source generates a continuous microwave signal having a frequency equal to a transition frequency between an other excited state of the qubit and the given excited state.

In accordance with another example, a method is provided for resetting a qubit comprising a superconducting loop and a compound Josephson junction. A first bias flux is provided to the superconducting loop. A second bias flux is provided to the compound Josephson junction. Each of the first bias flux and the second bias flux are provided such that a given excited state of the qubit is near a top of a potential barrier associated with a potential of the qubit. A continuous microwave signal is generated having a frequency equal to a transition frequency between an other excited state of the qubit and the given excited state.

In accordance with a further example, a method is provided for resetting a flux qubit comprising a superconducting loop and a compound Josephson junction. A first bias flux is provided to the superconducting loop. A second bias flux is provided to the compound Josephson junction. Each of the first bias flux and the second bias flux are provided such that a second excited state of the flux qubit is near a top of a potential barrier associated with a potential of the qubit. A continuous microwave signal is generated having a frequency equal to a transition frequency between a first excited state of the qubit and the second excited state.

DETAILED DESCRIPTION

As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements. Ordinal terms, such as "first" or "second" are generally arbitrary and do not imply a specific order except where used to describe excited states of a qubit or other quantum system. For example, the first excited state is the state of the qubit immediately above the ground state.

Systems and methods described herein provide a microwave-based reset, or initialization, of a persistent current qubit. The systems and methods illustrated herein employ a microwave tone that causes the persistent current qubit to transition from the excited state to the ground state through an intermediary state. This microwave-based reset allows for the use of only low-pass filtered DC flux bias lines for device tuning and incorporates a narrowband microwave drive for reset, which gives lower noise and less decoherence.

Figure 1:
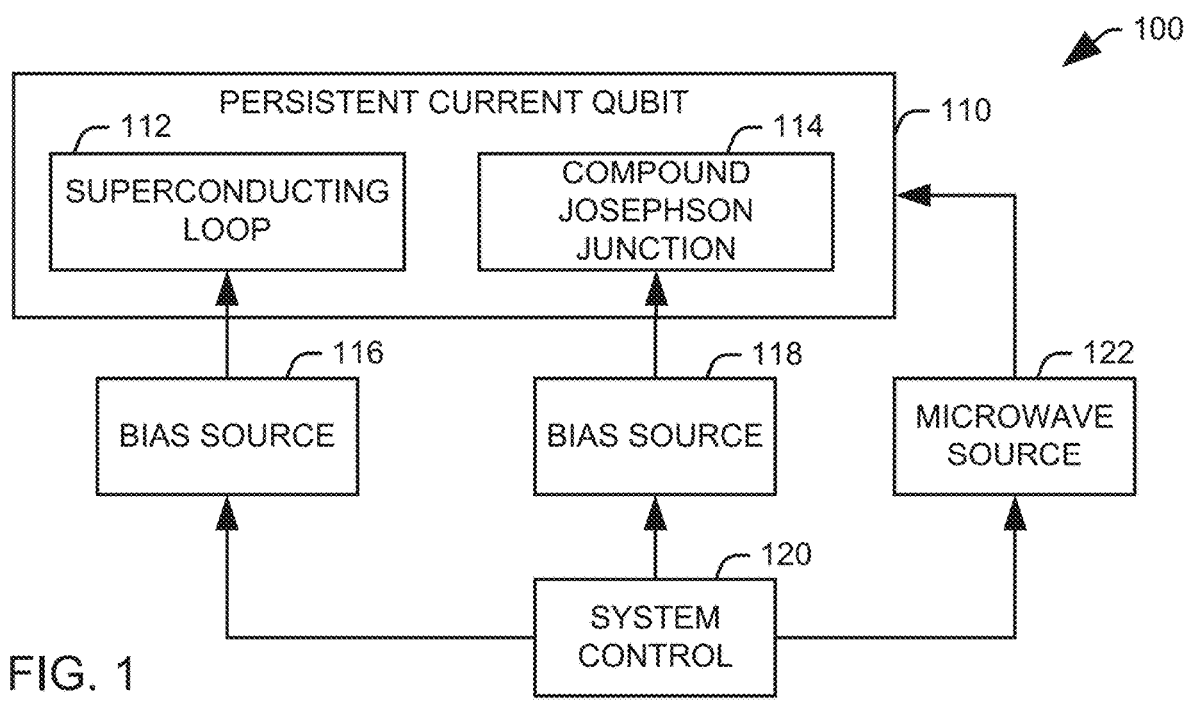
FIG. 1 illustrates one example of a system for resetting a persistent current qubit into a ground state.

FIG. 1 illustrates one example of a system 100 for resetting a persistent current qubit 110 into a ground state. The persistent current qubit 110 can be implemented, for example, as a flux qubit. The persistent current qubit 110 comprises a superconducting loop 112 interrupted by a compound Josephson junction 114. In one implementation, the compound Josephson junction 114 is implemented as a direct current superconducting quantum interference device (DC SQUID). A first bias source 116 provides a first bias to the superconducting loop, and a second bias source 118 provides a second bias to the compound Josephson junction. In one implementation, each of the first bias source 116 and the second bias source 118 can provide a magnetic flux. In one example, the qubit 110 can be tuned via the first and second bias sources 116 and 118 to assume a double-well potential, in which the energy states of the device include states in two potential wells separated by a potential barrier. In this example, the first bias source 116 controls a symmetry of the two wells, that is, the depth of the wells relative to one another, and the second bias source 118 controls a height of the potential barrier between the two wells.

Each of the first bias source 116 and the second bias source 118 are responsive to a system control 120 to allow a first value to be selected for the first bias source and a second value to be selected for the second bias source. In one implementation, the values for the first bias and the second bias can be selected from a range between zero and one flux quantum. A microwave source 122 is responsive to the system control 120 to generate a microwave signal having a frequency equal to a transition frequency between an excited state just above a ground state and a selected excited state of the qubit assembly.

When a reset of the qubit is desired, the system control 120 can instruct the first bias source 116 and the second bias source 118 to select values for the first and second biases to provide, within the potential wells, a multi-level quantum system. In one example, the value for the second bias is set between three-fifths and four-fifths of a flux quantum during the reset process. In particular, the height of the potential barrier and the asymmetry between the wells can be tuned such that the ground state in one well is near a bottom of the well and an excited state is near the top of the potential barrier. By "near a top of the potential barrier," it is meant that the excited state has a significant probability amplitude in both wells of the potential. The microwave source 122 can then be instructed to generate the microwave signal at the frequency equal to a transition frequency between the excited state just above the ground state and the selected excited state. This has the effect of moving the population of the excited state just above the ground state into the selected excited state. From there, the population will either relax back into the excited state just above the ground state to be driven back into the selected excited state by the microwave excitation or relax into the ground state. An arbitrary level of population can be forced into the ground state by maintaining the excitation for a sufficient period of time, which varies with the desired fidelity of the reset into the ground state. In one example, the period of time is predetermined as a function of a relaxation time from the selected excited state to the ground state.

In general, the selected excited state will be the excited state near the top of the potential barrier, but it will be appreciated that a multistage approach can be used, in which a first microwave signal is applied to excite the population of the excited state just above the ground state to a first selected excited state and a second microwave signal is used to excite the population of the first selected excited state into a second excited state. In this instance, the first microwave signal can have a first frequency equal to a transition frequency between the excited state just above the ground state and the first selected excited state, and the second microwave signal can have a second frequency equal to a transition frequency between the first selected excited state and the second selected excited state. Further, it will be appreciated that the selected excited state is not necessarily the state immediately higher than the excited state just above the ground state, and that the microwave signal can be selected such that the population is excited to a state two or more levels higher than the excited state just above the ground state.

Figure 2:
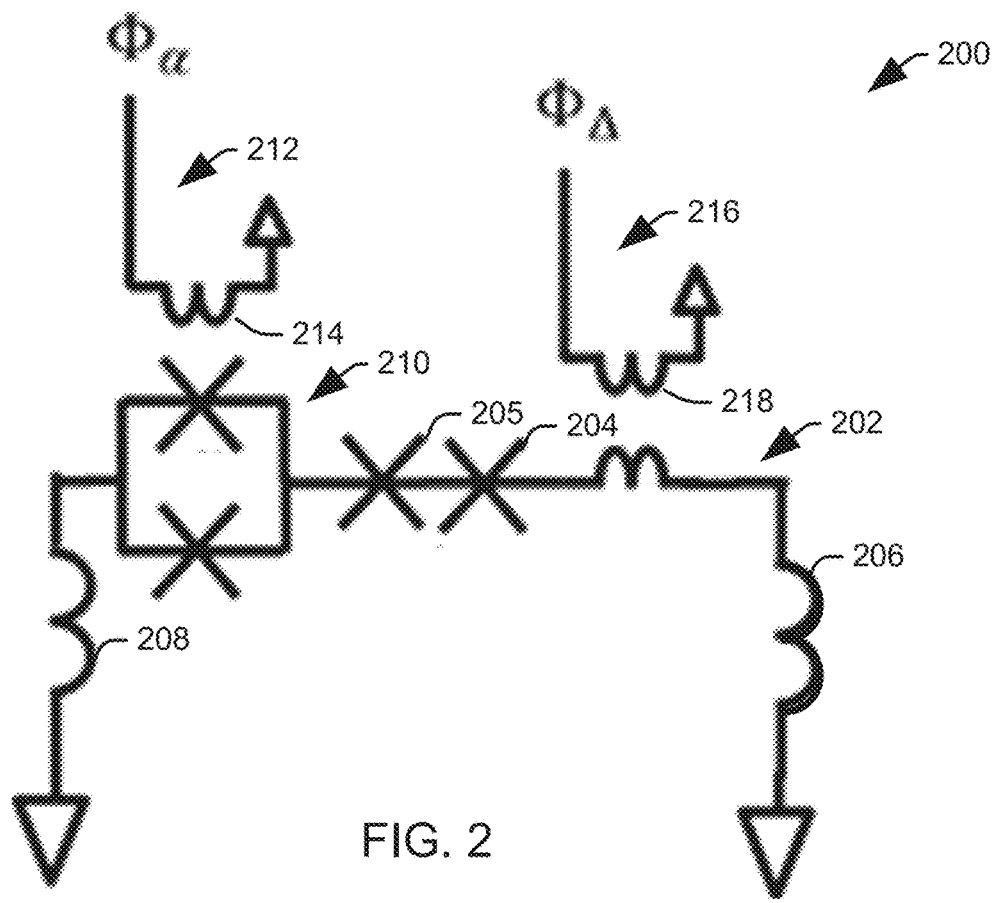
FIG. 2 illustrates one example of a flux qubit that can be reset using a microwave-based reset process.

FIG. 2 illustrates one example of a persistent current qubit 200, specifically a flux qubit, that can be reset using a microwave-based reset process. The qubit 200 includes a superconducting loop 202 interrupted by a first Josephson junction 204, a second Josephson junction 205, a first inductor 206, and a second inductor 208, and a compound Josephson junction 210. A first flux source 212, which provides flux to the compound Josephson junction 210, comprises a first current source, $\Phi_{\alpha}$, connected to a first inductor 214, with the flux produced at the inductor being a function of the magnitude of the current provided to the first inductor. A second flux source 216, which provides flux to the superconducting loop 202, comprises a second current source, $\Phi_A$, connected to a second inductor 218, with the flux produced at the inductor being a function of the magnitude of the current provided to the second inductor.

Figure 3:
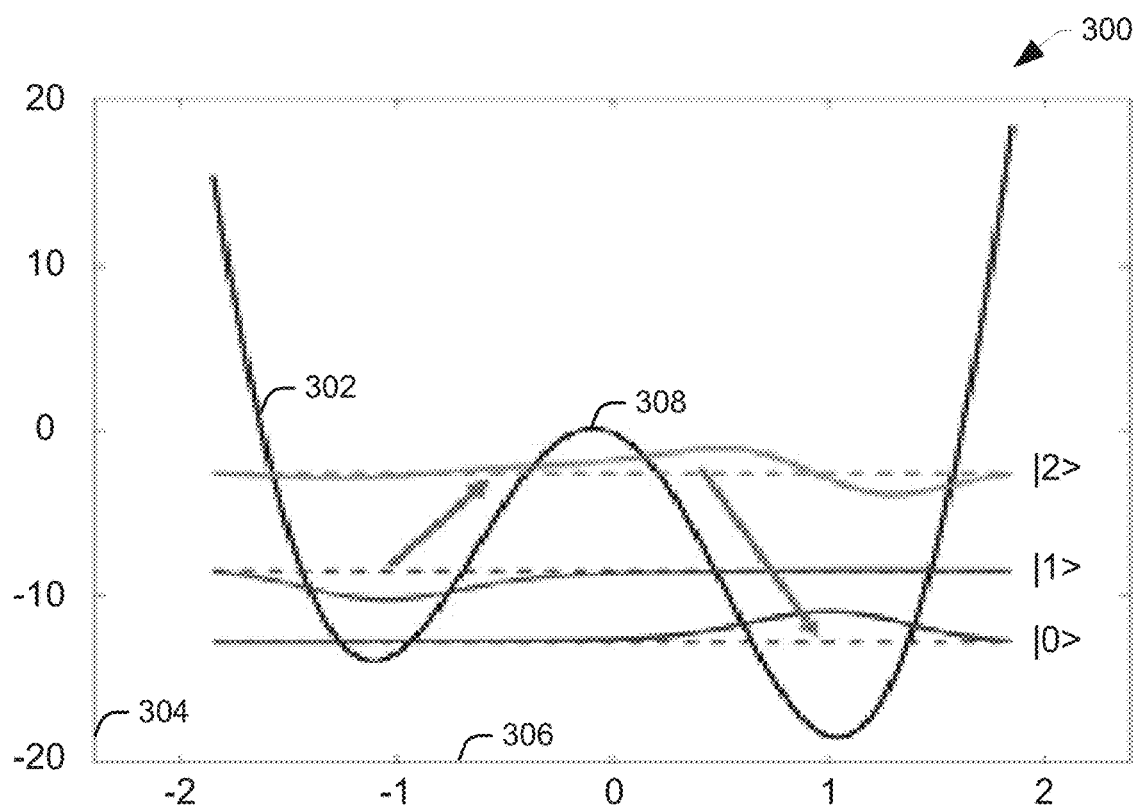
FIG. 3 is a chart representing the potential of the flux qubit of FIG. 2.

When a reset of the flux qubit to the ground state is desired, the two flux sources 212 and 216, can be adjusted to tune the qubit to produce a three-level quantum system. Specifically, when the parameters for the critical currents of the Josephson junctions in the compound Josephson junction 210 and the superconducting loop 202 have been chosen in the correct regime and the second bias is set to have a value, or magnitude, approximately seven-tenths of a flux quantum, the potential energy of the device has a double-well character as seen in FIG. 3. In this biasing configuration, the first flux source 212 tunes the height of the barrier between the two potential wells for the flux qubit 200, and the second flux source 216 tunes the asymmetry of the two potential wells for the flux qubit 200, effectively tilting the potential to one side, such that one well is deeper than the other.

FIG. 3 is a chart 300 representing the potential 302 of the flux qubit 200, with the energy represented on the vertical axis 304 in gigahertz, or more precisely, in units of a product of h and the frequency expressed in gigahertz, where h is Planck's constant, and a phase of the qubit at the second Josephson junction 205 represented on the horizontal axis 306. The chart illustrates a ground, or lowest energy state, $|0\rangle$, a first excited state, $|1\rangle$, and a second excited state, $|2\rangle$. In a reset, it is desirable to force the flux qubit to occupy only the lowest energy state, $|0\rangle$, and thus any population in the excited state, $|1\rangle$ must be forced to transition between wells. As can be seen in FIG. 3, there is a large potential barrier 308 between the two wells, which makes thermal transitions over the barrier very unlikely and the rate of quantum mechanical tunneling into the other well very low for the first excited state. However, when the flux sources 212 and 216 are tuned appropriately, the potential barrier separating the wavefunction of the second excited state is significantly reduced and the second excited state is therefore spread between the two potential wells.

To complete the reset, the flux qubit 200 is provided with a microwave signal from a microwave drive (not shown) that is resonant with the $|1\rangle$ to $|2\rangle$ transition frequency, $f_{12}$, to excite the $|1\rangle$ state population up to $|2\rangle$. From there it can either Rabi oscillate back into $|1\rangle$ or it could decay down into $|0\rangle$ through dissipation to the environment. While the drive is being applied, any population that oscillates back to $|1\rangle$ will continue to be driven back up to $|2\rangle$ and given a chance to decay into $|0\rangle$. Since the transition frequency between the first excited state and the second excited state is different from the transition frequency, $f_{02}$, between the ground state and the second excited state, the microwave signal will not drive population from $|0\rangle$ to $|2\rangle$, and as long as $hf_{02} \gg k_B T$, where T is the temperature and $k_B$ is Boltzmann's constant, thermal processes will not cause $|2\rangle$ to repopulate, either. After the microwave drive is applied for a sufficient interval, essentially all population in $|1\rangle$ will have transitioned to $|1\rangle$ through decay from $|2\rangle$, and the qubit is reset to the ground state. It will be appreciated that the sufficient interval can be based on a known or estimated relaxation time for the second excited state.

Figure 4:
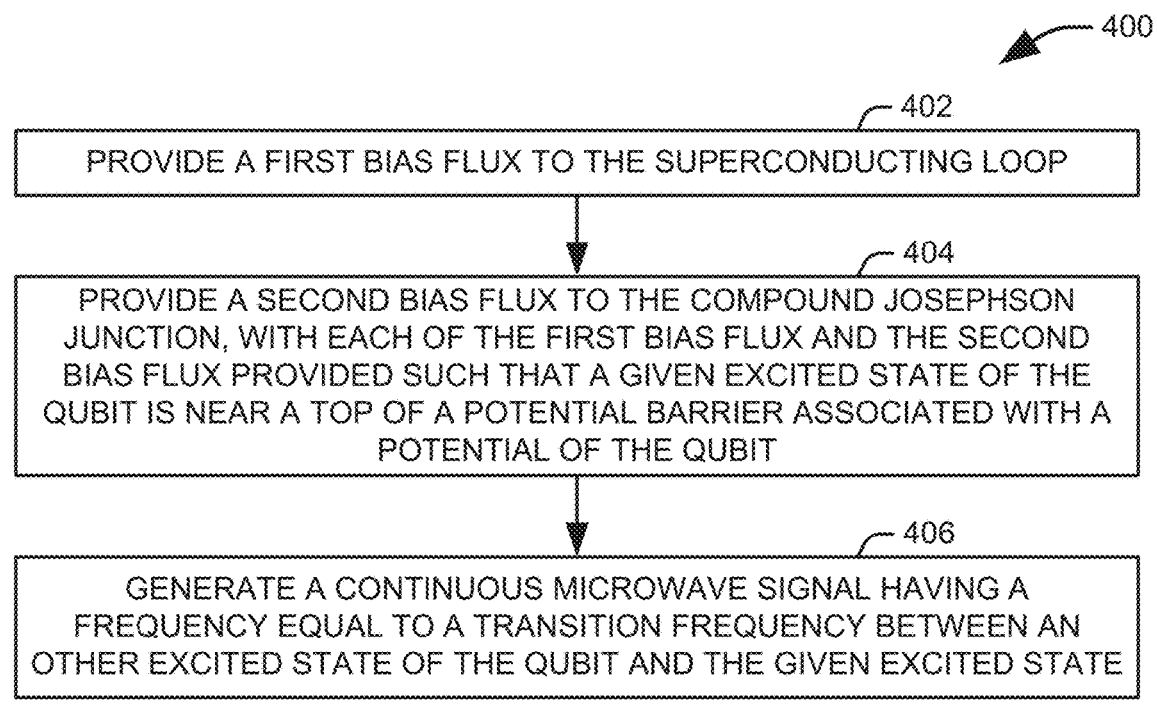
FIG. 4 illustrates a method for resetting a flux qubit comprising a superconducting loop and a compound Josephson junction.
Figure 5:
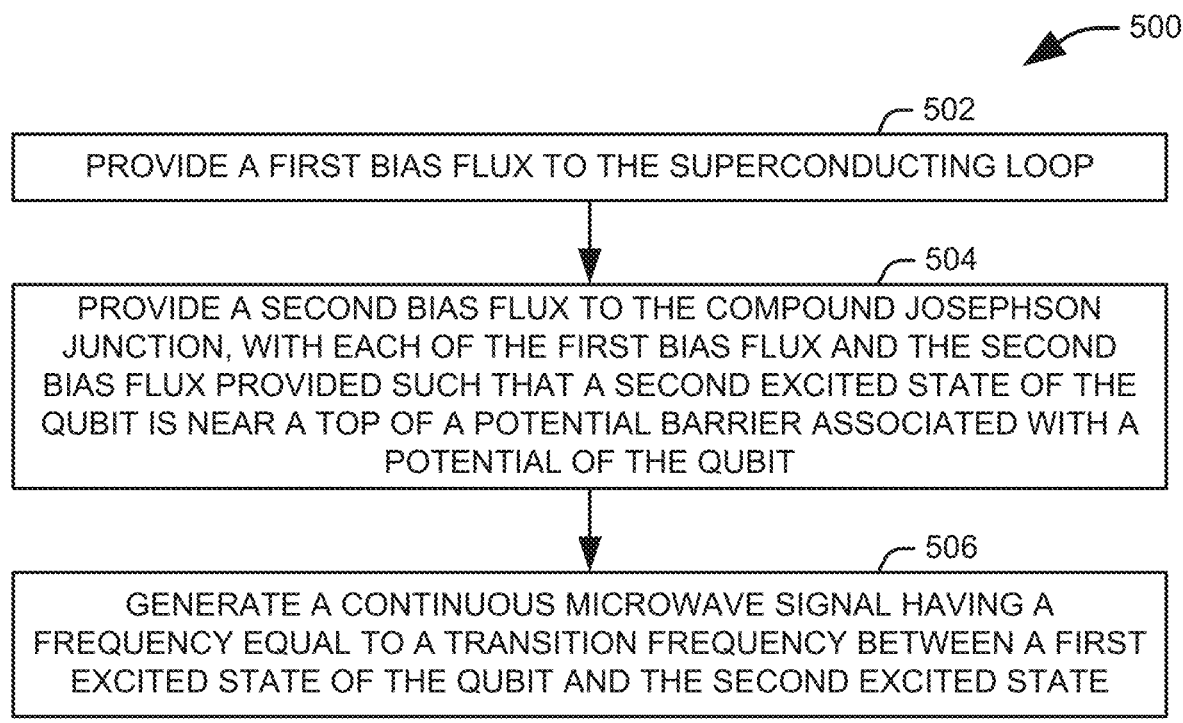
FIG. 5 illustrates another method for resetting a flux qubit comprising a superconducting loop and a compound Josephson junction.

In view of the foregoing structural and functional features described above, example methods will be better appreciated with reference to FIGS. 4 and 5. While, for purposes of simplicity of explanation, the example methods of FIGS. 4 and 5 are shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 4 illustrates a method 400 for resetting a qubit comprising a superconducting loop and a compound Josephson junction. At 402, a first bias flux is provided to the superconducting loop. At 404, a second bias flux is provided to the compound Josephson junction. Each of the first bias flux and the second bias flux are provided such that a given excited state of the qubit is near a top of a potential barrier associated with a potential of the qubit. It will be appreciated that, for various implementations of the flux qubits, there are practical limits to the height of the barrier, and thus limits to the range of excited states that can be selected as the given excited state. In one example, the first bias flux and the second bias flux are provided such that an other excited state, below the given excited state, has a probability amplitude split between a first well of the qubit potential and a second well of the qubit potential. A magnitude of the first bias flux can be selected such that the first well is deeper than the second well, such that the other excited state is farther from a bottom of the first well than the bottom of the second well. The magnitude of the second bias flux can be selected to tune the height of the barrier near the given excited state. In one example, the second bias flux is provided with a magnitude between three-fifths and four-fifths of a flux quantum.

At 406, a continuous microwave signal is generated having a frequency equal to a transition frequency between the other excited state of the qubit and the given excited state. This has the effect of driving population from the other excited state to the given excited state, from which it can relax into the ground state. To this end, the continuous microwave signal can be generated for a predetermined time, wherein the predetermined time is a function of a relaxation time of the qubit from the given excited state to a ground state of the qubit. In one example, there is an intermediate excited state between the given excited state and the other excited state, and the population is excited by two or more states. In another example, a second continuous microwave signal having a second frequency equal to a transition frequency between an excited state immediately above a ground state of a qubit and the other excited state of the qubit can be used to drive population from the excited state immediately above a ground state of a qubit to the other excited state, before and/or during the use of the first microwave signal drives the population from the other excited state to the given excited state.

FIG. 5 illustrates another method 500 for resetting a flux qubit comprising a superconducting loop and a compound Josephson junction. At 502, a first bias flux is provided to the superconducting loop. At 504, a second bias flux is provided to the compound Josephson junction. Each of the first bias flux and the second bias flux are provided such that a second excited state of the flux qubit is near a top of a potential barrier associated with a potential of the flux qubit. In particular, a magnitude of each flux is selected to provide an asymmetric two-well potential with the population of the second excited state able to move relatively freely between the two wells, but with the population of the first excited state split between the two wells. In one implementation, the second flux bias is provided with a magnitude between three-fifths and four-fifths of a flux quantum.

At 506, a continuous microwave signal having a frequency equal to a transition frequency between a first excited state of the qubit and the second excited state is generated. This has the effect of driving the population of the first excited state into the second excited state. From there, it can either relax back to the first excited state, from which it can be driven back into the second excited state, or it can relax to the ground state, where it will remain in the absence of thermal processes. In one example, the continuous microwave signal is provided for a predetermined time that is a function of a relaxation time of the qubit from the second excited state to a ground state of the flux qubit.

In the preceding description, specific details have been set forth in order to provide a thorough understanding of example implementations of the invention described in the disclosure. However, it will be apparent that various implementations may be practiced without these specific details. For example, circuits, systems, networks, processes, and other components may be shown as components in block diagram form in order not to obscure the example implementations in unnecessary detail. In other instances, well-known circuits, processes, algorithms, structures, and techniques may be shown without unnecessary detail in order to avoid obscuring the examples. The description of the example implementations will provide those skilled in the art with an enabling description for implementing an example of the invention, but it should be understood that various changes may be made in the function and arrangement of elements without departing from the spirit and scope of the invention. Accordingly, the present invention is intended to embrace all such alterations, modifications, and variations that fall within the scope of the appended claims.

What is claimed is:

1. An assembly comprising:
   a qubit comprising a superconducting loop interrupted by a compound Josephson junction;
   a first bias source that provides a first bias to the superconducting loop;
   a second bias source that provides a second bias to the compound Josephson junction, each of the first bias source and the second bias source being responsive to a system control to allow a first value to be selected for the first bias and a second value to be selected for the second bias, each of the first value and the second value being selected such that a given excited state of the qubit is near a top of a potential barrier associated with a potential of the qubit; and
   a microwave source that generates a continuous microwave signal having a frequency equal to a transition frequency between an other excited state of the qubit and the given excited state.

2. The assembly of claim 1, wherein the first value and the second value are selected such that the other excited state has a population split between a first well of the qubit potential and a second well of the qubit potential.

3. The assembly of claim 2, wherein the first value is selected such that the first well is deeper than the second well, such that the other excited state is farther from a bottom of the first well than the bottom of the second well.

4. The assembly of claim 1, wherein the first bias and the second bias are each provided as a magnetic flux, and the second value is selected to be between three-fifths and four-fifths of a flux quantum.

5. The assembly of claim 1, wherein the microwave source is responsive to the system control to provide the continuous microwave signal for a predetermined time, wherein the predetermined time is a function of a relaxation time of the qubit from the given excited state to a ground state of the qubit.

6. The assembly of claim 1, wherein the microwave source is a first microwave source, the frequency is a first frequency, and the continuous microwave signal is a first continuous microwave signal, the assembly further comprising a second microwave source that generates a second continuous microwave signal having a second frequency equal to a transition frequency between an excited state immediately above a ground state of the qubit and the other excited state of the qubit.

7. The assembly of claim 1, wherein an intermediate excited state is between the given excited state and the other excited state.

8. The assembly of claim 1, wherein the qubit is a flux qubit.

9. The assembly of claim 1, wherein the given excited state is a second excited state of the qubit and the other excited state is a first excited state of the qubit.

10. A method for resetting a qubit comprising a superconducting loop and a compound Josephson junction, the method comprising:
    providing a first bias flux to the superconducting loop;
    providing a second bias flux to the compound Josephson junction, wherein each of the first bias flux and the second bias flux are provided such that a given excited state of the qubit is near a top of a potential barrier associated with a potential of the qubit; and
    generating a continuous microwave signal having a frequency equal to a transition frequency between an other excited state of the qubit and the given excited state.

11. The method of claim 10, wherein the first bias flux and the second bias flux are provided such that the other excited state has a probability amplitude split between a first well of the qubit potential and a second well of the qubit potential.

12. The method of claim 11, wherein a magnitude of the first bias flux is selected such that the first well is deeper than the second well, such that the other excited state is farther from a bottom of the first well than the bottom of the second well.

13. The method of claim 10, wherein an intermediate excited state is between the given excited state and the other excited state.

14. The method of claim 10, wherein the frequency is a first frequency, the continuous microwave signal is a first continuous microwave signal, and the method further comprising a generating a second continuous microwave signal having a second frequency equal to a transition frequency between an excited state immediately above a ground state of the qubit and the other excited state of the qubit.

15. The method of claim 10, wherein the second bias flux is provided with a magnitude between three-fifths and four-fifths of a flux quantum.

16. The method of claim 10, wherein generating the continuous microwave signal having the frequency equal to the transition frequency between the other excited state of the qubit and the given excited state comprises generating the continuous microwave signal for a predetermined time, wherein the predetermined time is a function of a relaxation time of the qubit from the given excited state to a ground state of the qubit.

17. The method of claim 10, wherein the given excited state is a second excited state of the qubit and the other excited state is a first excited state of the qubit.

18. A method for resetting a flux qubit comprising a superconducting loop and a compound Josephson junction, the method comprising:
    providing a first bias flux to the superconducting loop;
    providing a second bias flux to the compound Josephson junction, wherein each of the first bias flux and the second bias flux are provided such that a second excited state of the flux qubit is near a top of a potential barrier associated with a potential of the flux qubit; and
    generating a continuous microwave signal having a frequency equal to a transition frequency between a first excited state of the flux qubit and the second excited state.

19. The method of claim 18, wherein the second bias flux is provided with a magnitude between three-fifths and four-fifths of a flux quantum.

20. The method of claim 18, wherein generating the continuous microwave signal having the frequency equal to the transition frequency between the first excited state and the second excited state comprises generating the continuous microwave signal for a predetermined time, wherein the predetermined time is a function of a relaxation time of the flux qubit from the second excited state to a ground state of the flux qubit.

* * * * *